US005525024A

United States Patent [19]

Freerks et al.

[11] Patent Number: 5,525,024
[45] Date of Patent: Jun. 11, 1996

[54] CASSETTE LOADER HAVING COMPOUND TRANSLATIONAL MOTION

[75] Inventors: Frederik W. Freerks, Cupertino; Kenneth D. Ames, San Jose, both of Calif.

[73] Assignee: Applied Materials, Inc., Santa Clara, Calif.

[21] Appl. No.: 293,999

[22] Filed: Aug. 17, 1994

[51] Int. Cl.⁶ ..................................................... B65G 49/07
[52] U.S. Cl. ........................ 414/416; 414/217; 414/786; 414/940
[58] Field of Search .......................... 414/217, 331, 414/416, 935, 940, 786

[56] References Cited

U.S. PATENT DOCUMENTS

| | | | |
|---|---|---|---|
| 4,636,128 | 1/1987 | Millis et al. | 414/217 |
| 4,744,715 | 5/1988 | Kawabata | 414/331 |
| 4,836,733 | 6/1989 | Hertel et al. | 414/416 X |
| 4,859,137 | 8/1989 | Bonora et al. | 414/940 X |
| 4,875,825 | 10/1989 | Tullis et al. | 414/940 X |
| 4,963,069 | 10/1990 | Wurst et al. | 414/940 X |
| 5,048,164 | 9/1991 | Harima | 414/940 X |
| 5,181,819 | 1/1993 | Sakata | 414/217 |
| 5,186,594 | 2/1993 | Toshima et al. | 414/217 |
| 5,443,348 | 8/1995 | Biche et al. | 414/416 |

FOREIGN PATENT DOCUMENTS 5090384  4/1993  Japan ..................... 414/940

*Primary Examiner*—James W. Keenan
*Attorney, Agent, or Firm*—Michael A. Glenn

[57] ABSTRACT

A cassette loading mechanism for semiconductor processing equipment reduces the possibility of repetitive stress injury that may occur as a result of repeatedly loading and unloading a cassette of substrates by eliminating manual cassette rotation. The loader receives a cassette and, by compound translational movement, rotates the cassette about 90° from a horizontal loading position, in which the substrates contained therein are positioned in a vertical orientation, to a position in which the substrates contained therein are positioned in a horizontal orientation, such that the cassette is aligned to the other components of the substrate handling system for substrate transfer. The cassette motions are interlocked with the cassette clamping mechanism and the cassette loader door and a cassette shuttle by pneumatic or electronic logic.

15 Claims, 15 Drawing Sheets

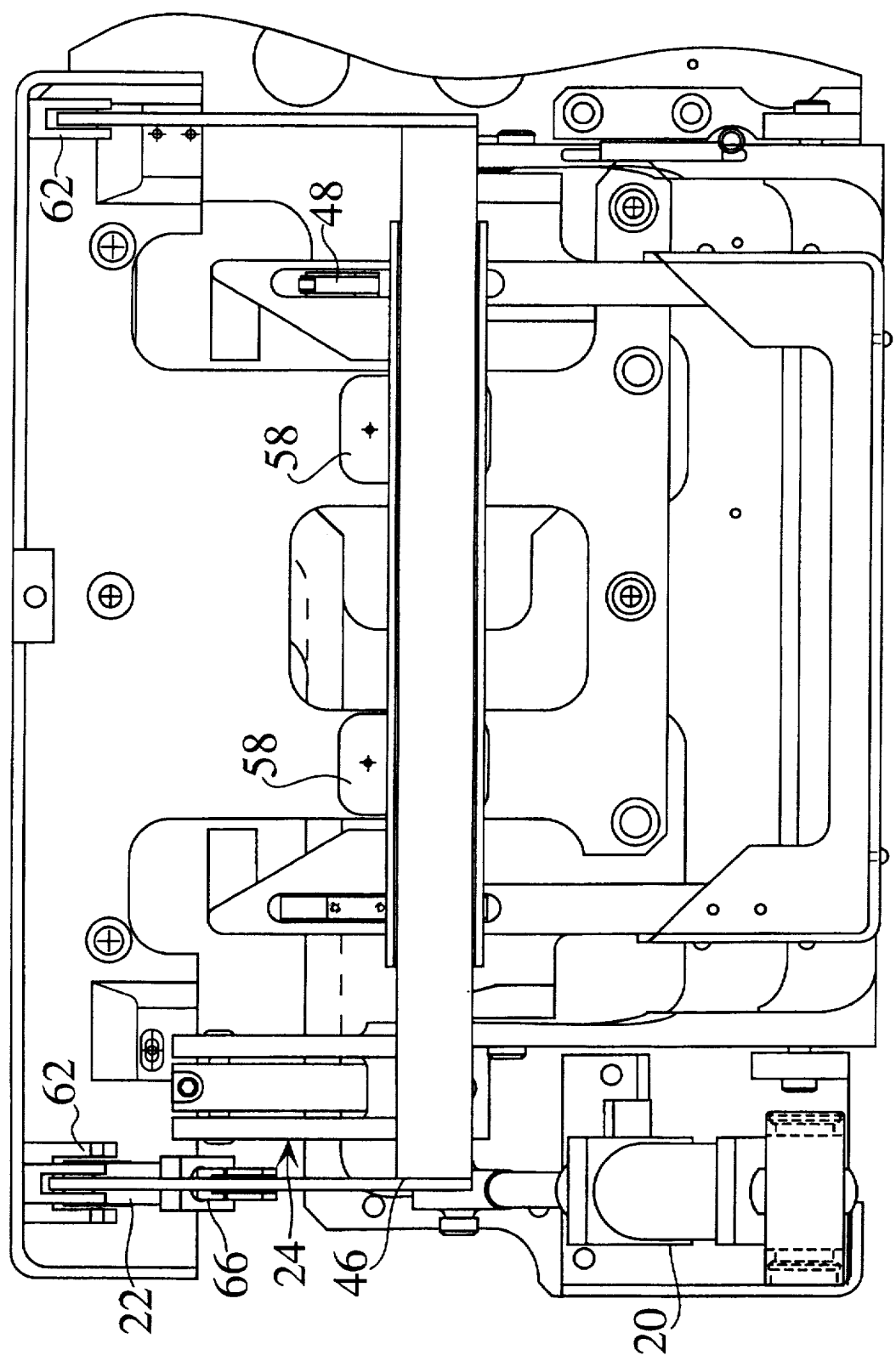

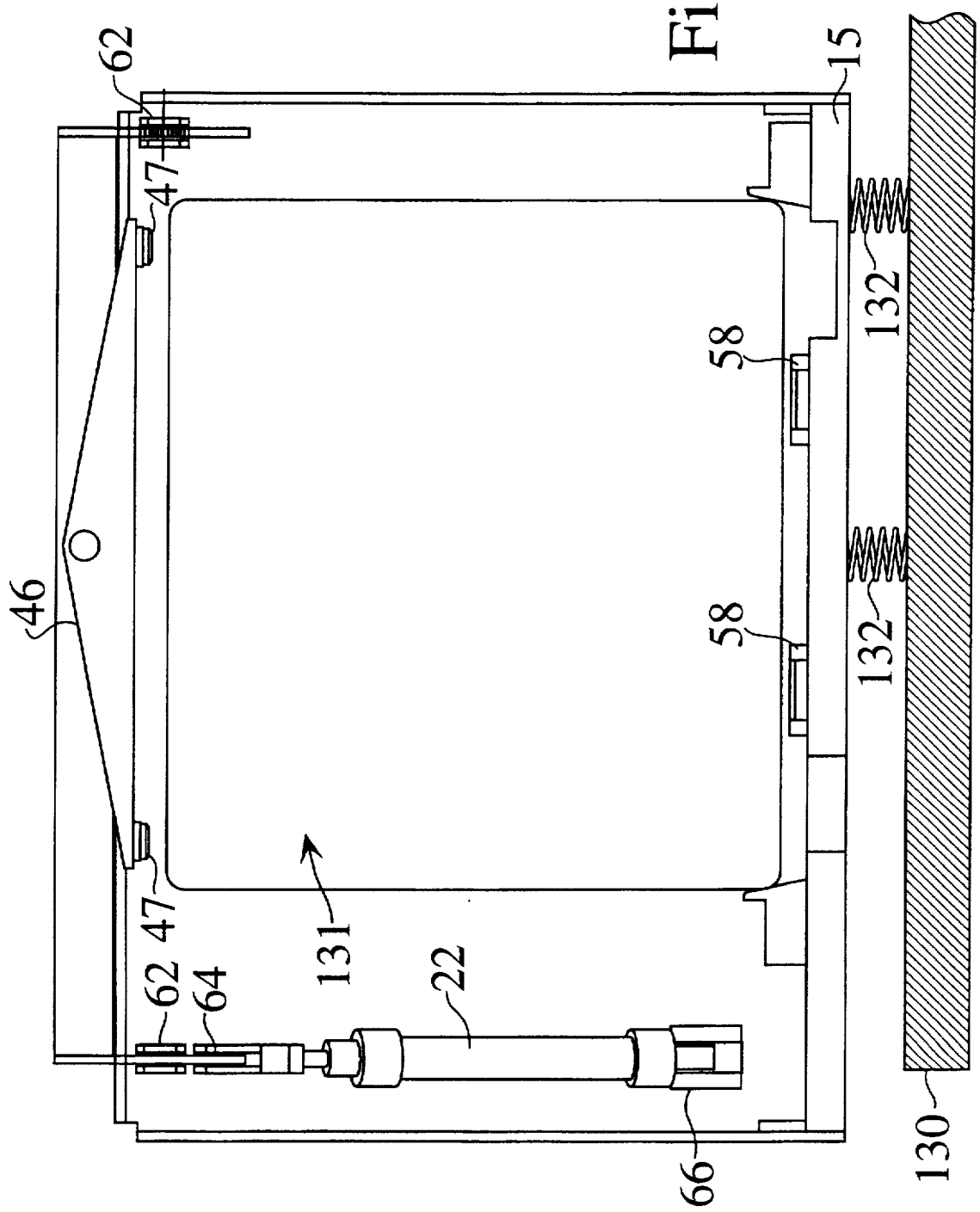

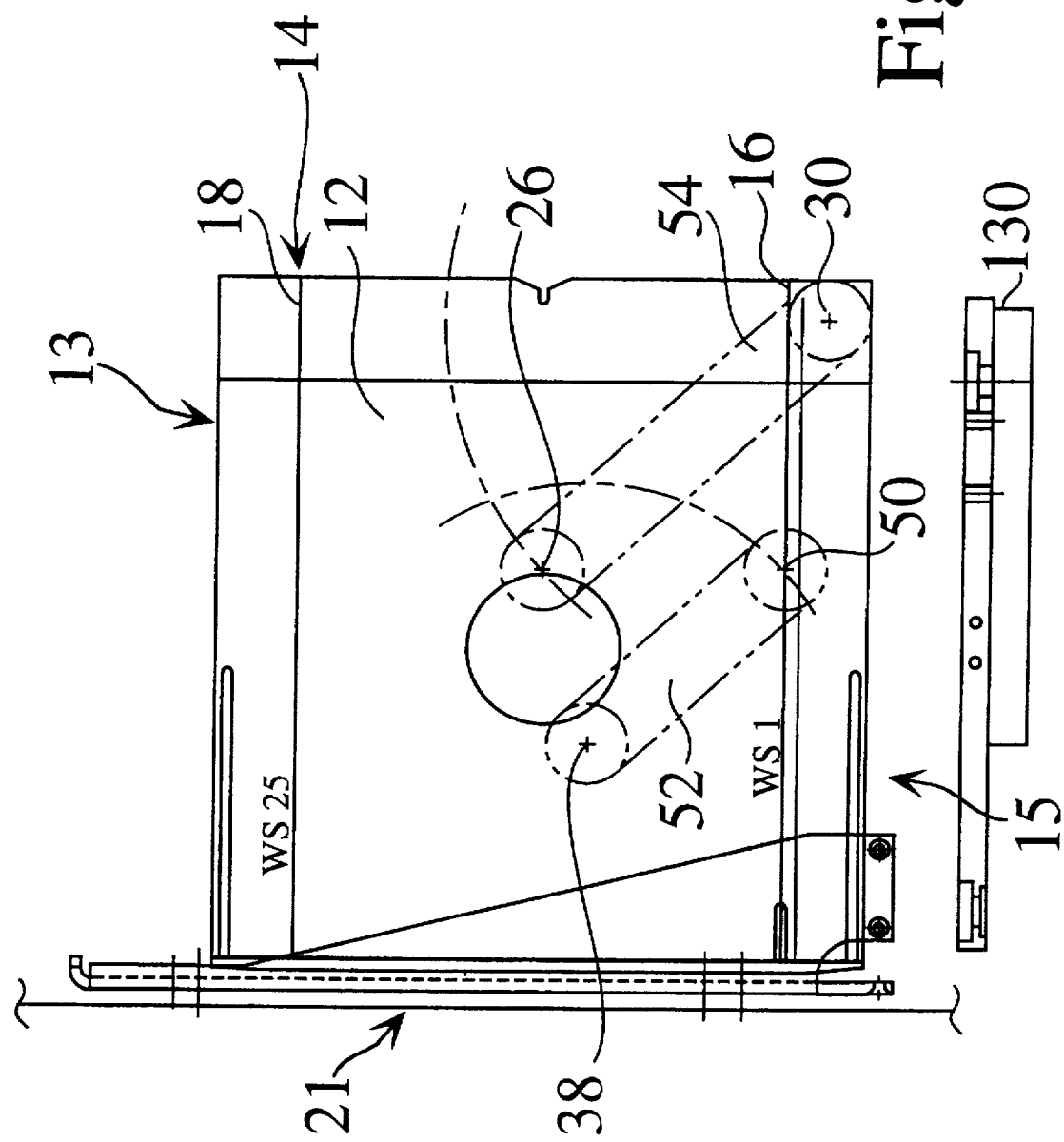

CASSETTE LOADER HAVING COMPOUND TRANSLATIONAL MOTION

BACKGROUND OF THE INVENTION

1. Technical Field

The present invention relates to a cassette loading station for semiconductor processing equipment. More particularly, the present invention relates to an ergonomic cassette loading station for automatically placing a cassette at a processing equipment loading port.

2. Description of the Prior Art

As knowledge is gained concerning hazards in the workplace, such hazards should, if possible, be immediately eliminated. It is also important to identify the potential for such hazards before any injuries can occur. For example, industry is presently concerned with repetitive stress syndrome and the use of ergonomic design to avoid repetitive body movements that may result in long term disability that is associated with repetitive stress syndrome.

Modern semiconductor process equipment is adapted to receive a cassette of semiconductor substrates. The cassette is loaded by an equipment operator. A cassette may contain anywhere from one to twenty-six or more substrates, may weigh up to 3.7 kilograms (10 pounds) or more, and may contain finished product having a value of $US 1 million or more.

A standard cassette is used to transfer semiconductor substrates, in which the substrates are positioned in a vertical orientation. The wafers are positioned within the cassette on parallel slots, tracks, or grooves on opposing sides of the cassette for transport in a vertical orientation to minimize the likelihood of contaminating particles settling on the wafer surface. The cassette itself is placed within a sealed environment when it is transported to reduce wafer exposure to contaminants within the ambient. The cassette has an opening at a top portion thereof through which the substrates are loaded and unloaded.

FIG. 1 is a perspective view of a multi-chamber semiconductor processing system 11 having two cassette loading ports 17, 19. To load the cassette into a typical substrate processing environment, the operator places the cassette into a loading position by extending his arms into the equipment while holding the cassette, and then rotates the cassette through about 90° of movement about a horizontal axis in front of the operator, such that the substrates are moved to a horizontal orientation for loading to, and unloading from, the process environment by a robot arm located within the process environment at the cassette loading port. The wafers are positioned in a horizontal position for loading and unloading to allow a robot to index the wafers within the context of a standard processing environment. Such rotation is therefore necessary to index and clamp the cassette in proper alignment with the process equipment.

An operator may load and unload a cassette in this manner 50–60 times during a typical work shift. It is thought that maximum ulnar deviation of the wrist should preferably not exceed 30°. Some believe that repetitive ulnar deviation of an operator's wrist at 90° may in time result in a repetitive stress injury. In view of the value of the substrates contained in the cassette, and the operator's awareness of this fact, it is not unreasonable to expect that the operator exerts significant pressure on the cassette to prevent dropping it, possibly increasing the stress placed on his wrists.

It is therefore important that ergonomic design for process equipment, especially where such machinery is repetitively loaded and unloaded by an operator, be pursued if industry is to continue the laudable goal of improving workplace safety.

SUMMARY OF THE INVENTION

The invention reduces the possibility of repetitive stress injury to a worker, especially to the worker's wrists, during the process of loading and unloading a cassette containing semiconductor substrates to and from semiconductor processing equipment. In the invention, an operator places a cassette on a carriage having a horizontal base, with the substrates in the cassette positioned in a vertical orientation. The carriage is coupled to an actuator and linkage mechanism that provides compound translational motion of the cassette through about 90° of rotation, such that the cassette is oriented in a vertical position, with the substrates contained therein oriented in a horizontal position. Thereafter, the cassette is clamped into position and the substrates may be transferred into the process environment by a robot arm.

The invention includes a stable platform that reduces the overhung load of the cassette. The cassette holder extends partially into a system door, where it cradles the base of the cassette. The door is opened to receive wafers from the cassette, and is otherwise closed to prevent contamination of the system. When placed, the cassette initially sits at a slight inclined angle that is less than half of the normal ulnar deviation of the operator's wrist and that meets the ergonomic requirements of the loader mechanism. The invention also assures minimum substrate jarring, while securely retaining the cassette as it is rotated to the vertical position.

Once the cassette is rotated to the vertical position, the cassette rests on a platform and the rotator mechanism is moved clear of the cassette, such that the cassette may be automatically aligned to the other components of the substrate handling system.

The cassette motions are interlocked with the cassette clamping mechanism and the cassette loader door. All interlocks and motions are accomplished with pneumatic or electronic logic, thereby obviating the need for system software. Thus, the invention is readily retrofittable to existing process equipment.

BRIEF DESCRIPTION OF THE DRAWINGS

FIG. 4 is a partially sectioned top plan view of a cassette loading mechanism according to the invention;

FIG. 5 is a partially sectioned elevation taken along section line A—A in FIG. 3 of a cassette loading mechanism according to the invention;

FIGS. 6a–6h provide a series of schematic side elevation views showing translational cassette loading motion according to the invention;

DETAILED DESCRIPTION OF THE INVENTION

The invention reduces the possibility of repetitive stress injury to a worker, especially to the worker's wrists, during the process of loading and unloading a cassette to and from a process machine. In the invention, the cassette is placed on a horizontal carriage with the substrates in the cassette positioned in a vertical orientation. The carriage includes an actuator and linkage mechanism that provides compound translational motion of the cassette through about 90° of rotation, such that the cassette is moved to a vertical position, with the substrates contained therein oriented in a horizontal position. Thereafter, the cassette is clamped into position and the substrates may be transferred into the process environment.

Figure 1:
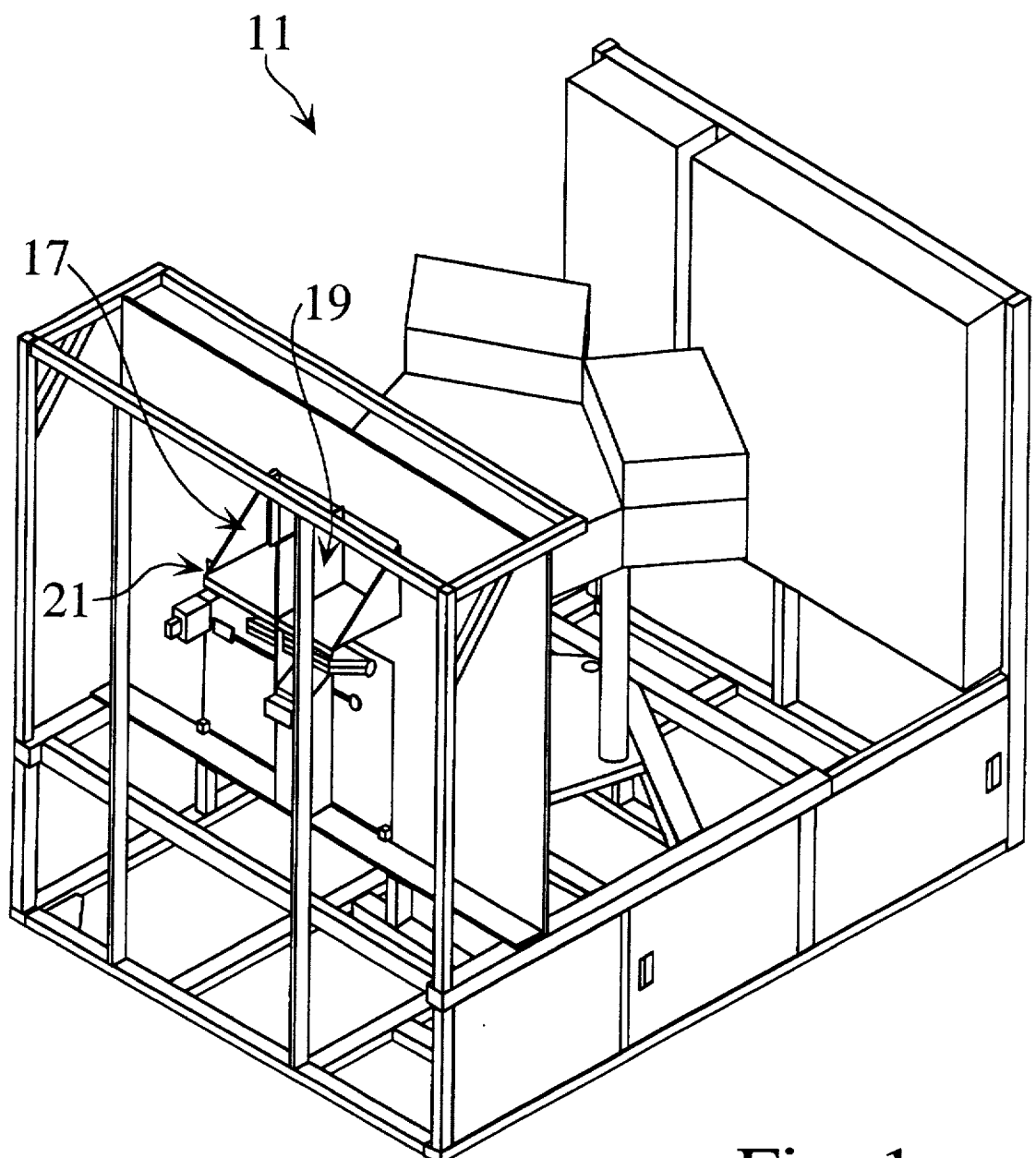
FIG. 1 is a perspective view of a typical wafer handler for a semiconductor wafer process tool having two cassette loading ports.
Figure 2:
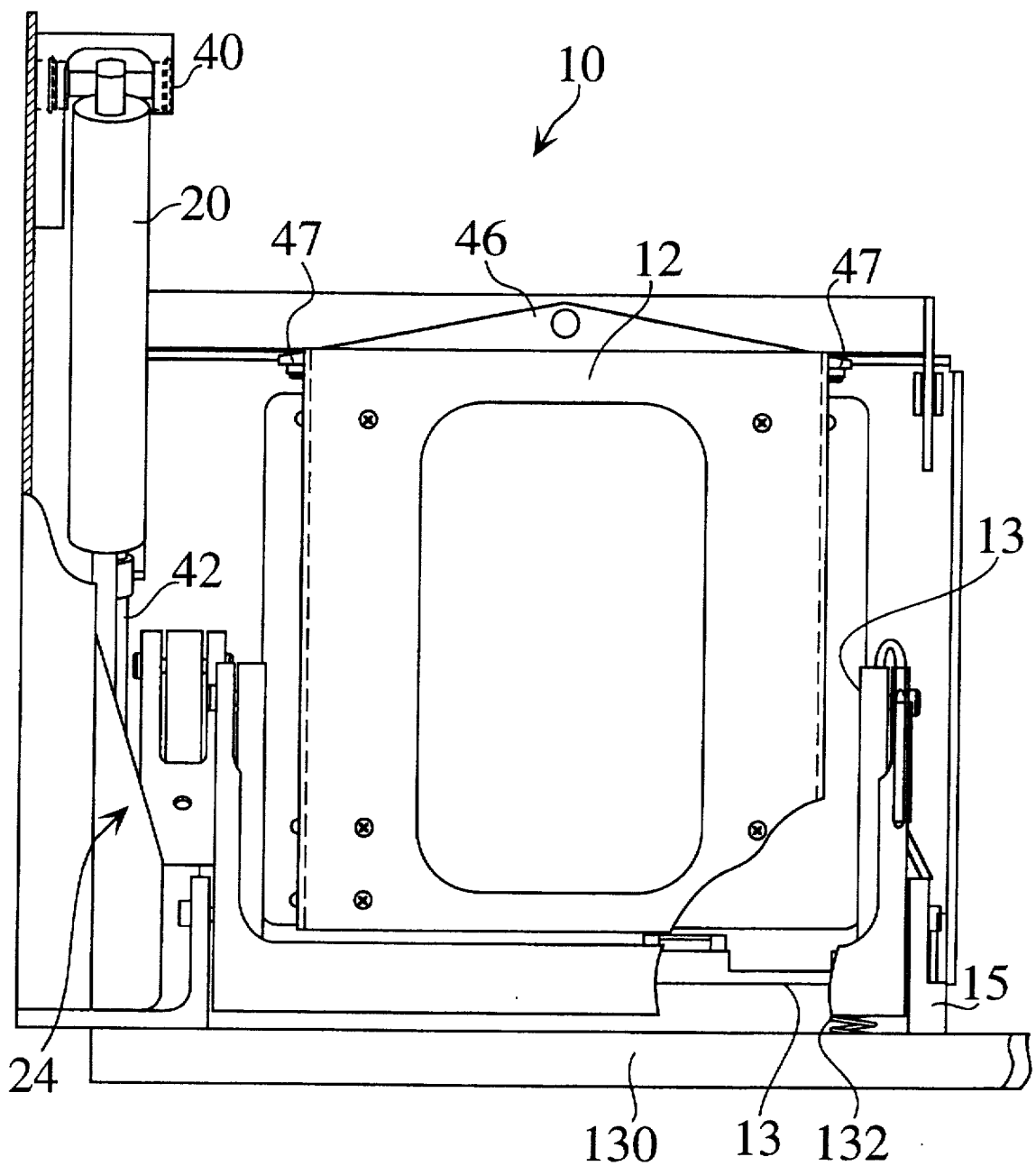
FIG. 2 is a partially sectioned front elevation view of a cassette loading mechanism according to the invention.

FIG. 2 is a partially sectioned front elevation view of a cassette loading mechanism according to the invention. The cassette loading mechanism is adapted to engage in abutting alignment with a front wall 21 of the processing system 11 shown in FIG. 1, such that one more cassettes of wafers may be rotated and aligned at a cassette loading port 17, 19 for insertion into a process system environment. The cassette loading mechanism extends partially into a system door, where it cradles the base of the cassette. The preferred embodiment of the invention is adapted to load and unload industry standard cassettes, but the invention is readily practiced with any wafer cassette that secures a stack of wafers in a spaced relation for wafer transport and/or handling.

When placed, the cassette initially sits at a slight inclined angle that is less than half of the normal ulnar deviation of the operator's wrist and that meets the ergonomic requirements of the loader mechanism. Once the cassette is rotated to the vertical position, the cassette rests on a platform and the cassette loading mechanism is moved clear of the cassette, such that the cassette may be automatically aligned to the other components of the substrate handling system. A typical cassette processing system is shown in FIG. 1. However, the invention is readily adapted to other systems, and is not intended only for the system shown in FIG. 1.

In FIG. 2, a cassette loading mechanism 10 is positioned for loading substrates contained therein to and from a process system by a robot arm (not shown). The cassette loading mechanism has a loading door 131 (shown in FIG. 5) behind which a cassette (shown in FIGS. 6a–6h containing several substrates 12, such that several substrate slots 14, including a first substrate slot 16 and a twenty-fifth substrate slot 18 are oriented horizontally) is positioned. The door provides a port through which a cassette may be placed for wafer loading and unloading. The door encloses the loading mechanism once the cassette is positioned, and when the loading mechanism is not in use, to seal the loading mechanism from the ambient and thereby prevent contamination of the loading mechanism and processing system.

The cassette is supported on a carriage 13 that is pivotally coupled to a frame 15 through a four-bar linkage mechanism 24 (best shown in FIG. 3), such that the carriage may be tilted through about 90° of movement, thereby rotating the cassette from an insertion position in which the substrates in the cassette are in a substantially vertical orientation to a loading/unloading position, in which the substrates are in a horizontal position. Such cassette manipulation allows an operator to insert the cassette without subjecting his wrists to excessive and possibly injurious ulnar deviation. The operation of the loader is described in greater detail below in connection with the discussion of FIG. 6.

Cassette tilting is referred to herein as translational motion. Such motion is accomplished by a motive means, for example by the tilt pneumatic cylinder 20, which is operable to extend and withdraw a cylinder shaft 42. The cylinder may be a standard pneumatic cylinder, and is preferably connected to a vacuum line to draw particles out of the cylinder during cylinder operation, and thereby prevent particle generation that may contaminate the system. Other motive means, such as stepper motors, may be used in the invention. The tilt cylinder 20 is coupled to a four-bar linkage mechanism, further illustrated in the side view shown in FIG. 3, that includes the following pivot points (please see FIGS. 6a–6h): two tilt cylinder pivot points 28, 40; two frame pivot points 30, 38; a linkage pivot point 26; and a carriage pivot point 50.

The second tilt cylinder pivot point 40 and the two frame pivot points 30, 38 are fixed to the frame. The linkage pivot point 26 and the carriage pivot point 50 are fixed to the carriage 13. The first tilt cylinder pivot point 28 is connected to the rotatable bar 52 and to the rotatable and extensible shaft 42. The resulting three-bar serial linkage connects the pivot points 40, 48 that are fixed to the frame. The carriage is rigidly fixed to the middle bar 56, and the tilt cylinder 20 moves the outside bars 52, 54. Thereby, as will be described more fully with reference to FIGS. 6a–6h, contraction or extension of the tilt cylinder 20 causes the carriage 13 to rotate.

The cassette loading mechanism also includes a clamp for securing the cassette against movement during cassette tilting and substrate loading/unloading. The clamp consists of a clamp pneumatic cylinder 22 (see FIGS. 3–5 for a more detailed description of the clamp). The clamp may alternatively be operated by such devices as a solenoid. The connections and operation of the linkage mechanism and the clamp is described in more detail below.

Operation of the loader may be controlled by a pneumatic or electronic logic system and includes a plurality of sensors, i.e. a cassette in place sensor 32; a tilt position sensor 34; a clamp cylinder sensor 44; and a cassette clamped sensor 48. Various other sensors may be used, such as loading door opened/closed sensors (discussed in FIG. 9 below). The sensors are coupled to a pneumatic or electronic logic circuit that controls the various actuators that operate the loader, such as the cylinders 20, 22, and solenoids (not shown). Operation of the pneumatic logic circuit is discussed in detail below in connection with FIGS. 7, 8, and 9.

Figure 3:
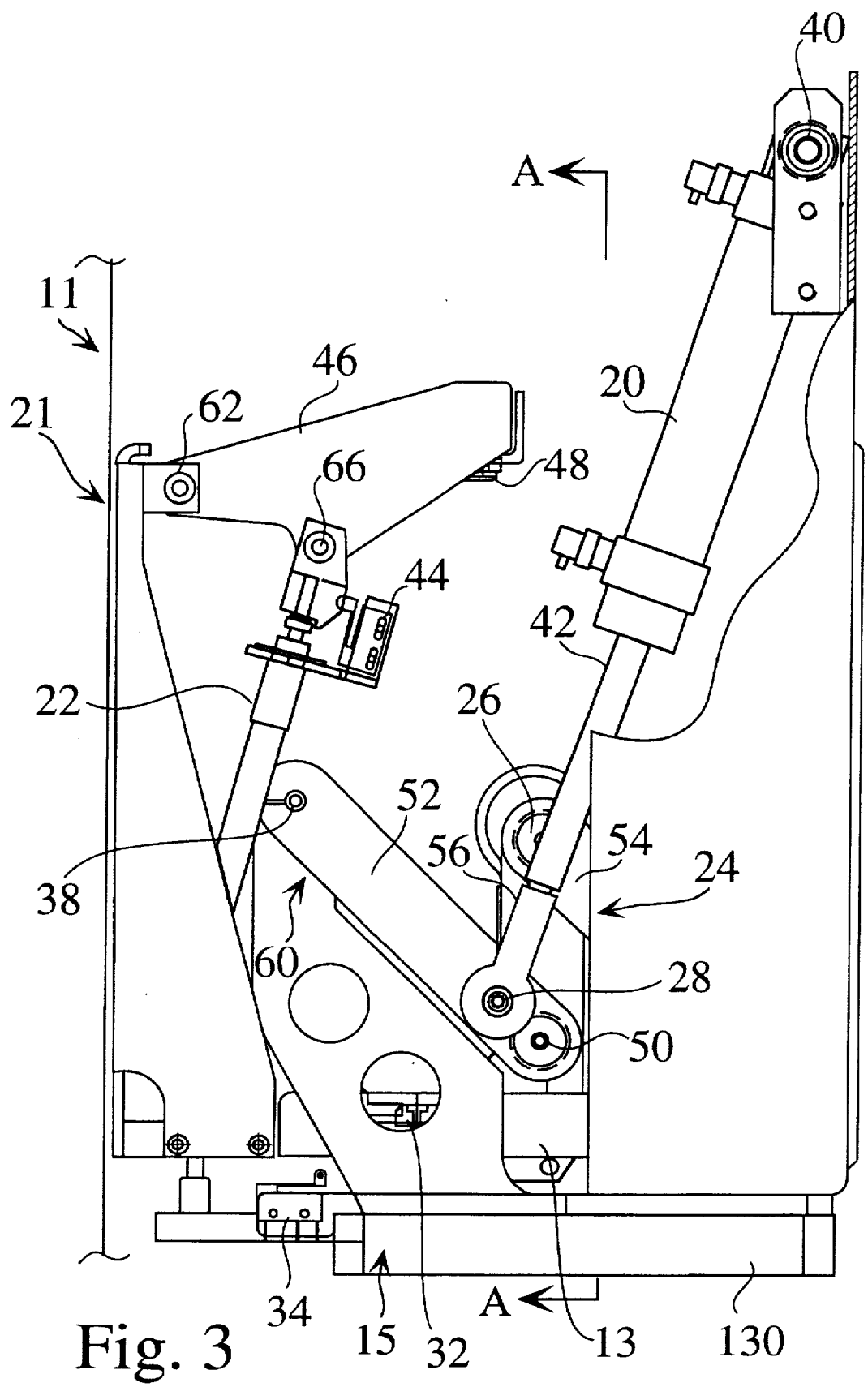
FIG. 3 is a partially sectioned side elevation view of a cassette loading mechanism according to the invention.

FIG. 3 is a partially sectioned side elevation view of a cassette loading mechanism according to the invention. In the figure, a four-bar linkage mechanism 24 is shown including a first link that consists of the tilt cylinder shaft 42. The tilt cylinder shaft 42 is pivotally coupled to one end of a first bar 52 at the pivot point 28 and at the other end to the frame 15 at the pivot point 40. The first end of bar 52 has another end that is pivotally coupled at the pivot point 38 to a portion 60 of the frame 15. A middle bar 56 has one end that is pivotally coupled to the one end of the first bar 52 and to the carriage 13 carrying the cassette at the pivot point 50. The middle bar 56 has another end that is pivotally coupled to one end of a third bar 54 at the pivot point 26, while the third bar has another end that is pivotally coupled to the frame 15 at the pivot point 30. Although a middle bar 56 is included in the exemplary embodiment of the invention described herein, such bar is not necessary for the operation of the invention and the bar may be dispensed with in other embodiments of the invention. The three bars 52, 54, 56 and the tilt cylinder 20 initially cooperate to lift the carriage 13 from the frame 15 about the axis of the pivot point 30, and thereafter operate to tilt the carriage 13 (please see FIGS. 6a to 6h).

When the tilt cylinder 20 is retracted, the cylinder shaft 42 pulls on the first bar 52 of the four-bar linkage mechanism 24, which both lifts the carriage at the pivot point 50, and which forces the third bar 54 upwardly, causing the carriage to tilt about the axis of the pivot point 30, although the carriage is not actually coupled to the pivot point 30. Simpler or more complex linkage mechanisms can effect the required rotation with or without additional translational movement.

FIG. 4 is a partially sectioned top plan view of a cassette loading mechanism according to the invention. An H-shaped cassette base, referred to as the H-bar (not shown) is engaged with two cassette alignment guides 58. The H-bar indexes the cassette on the carriage, i.e. the H-bar has inner edges that engage with, and slide along, outer edges of the alignment guides. The loading mechanism is readily adapted to accept any type of cassette as may be used to transport wafers. Typically the cassette is transported to and from the loading mechanism in a sealed transport box. The cassette used in the exemplary embodiment of the invention is a cassette adapted to carry a plurality of 200 millimeter (8 inch) wafers. The cassette is manufactured in accordance with SEMI standards by such companies as the Fluoroware Corporation.

The cassette loading mechanism typically provides about three degrees of free movement, i.e. pitch, roll, and elevation, between the cassette and the carriage to allow alignment of the cassette with the substrate transfer robot (not shown) before the cassette is clamped. The guides position the cassette into alignment when it is initially placed in the loading mechanism. Once positioned, as indicated for example by the sensor 48, the cassette may then be rotated into the substrate loading/unloading position or vice versa. Placement of the loading mechanism relative to the processing system is not critical, and only requires that the cassette be delivered to the processing system in sufficient proximity to the processing system load lock that a robot internal thereto may load and unload wafers between the cassette and the processing system.

Various guide configurations may be provided, depending upon the application to which the invention is put, for example depending upon the base configuration of the cassette. The guide blocks in the exemplary embodiment of the invention are formed of Delrin AF, although other materials may also be used to fabricate the guide blocks, e.g. Teflon®. The guide blocks may also be tapered to allow a progressively declining tolerance to force the cassette into precision alignment as it progresses along the edges of the guide blocks.

FIG. 4 also shows the clamp arm 46. In the figure, the clamp arm extends across an upper portion of the cassette (not shown in the figure), such that even pressure is exerted across the cassette. FIG. 5 is a partially sectioned elevation taken along section line A—A in FIG. 3 of a cassette loading mechanism according to the invention. As shown in FIGS. 4 and 5, the clamp cylinder 22 is arranged for pivotal movement about two pivot points 64, 66 (FIG. 5) connected respectively to a clamp arm 46 and the carriage 13. When actuated, the cylinder rotates the clamp arm 46 about two coaxial clamping pivot points 62 fixed to the carriage 13 to engage/disengage the clamp arm and an upper portion of the cassette, thereby securing the cassette against the carriage to thereby prevent cassette movement during substrate loading/unloading. The figure shows the clamp arm 46, including two clamp points 47 which are adapted to engage with and secure the cassette in place during cassette clamping. The clamp points typically include a resilient surface that provides compressive bias to the cassette, while yielding to avoid damaging the cassette through the exertion of excessive clamping force.

FIG. 5 also shows a base 130 that supports the loading mechanism frame and carriage via a pair of resilient supports 132. The supports 132 provide some play in the positioning of the loading mechanism relative to a process environment, while also damping any shocks that may otherwise jar or damage wafers contained within the cassette.

Figure 6B:
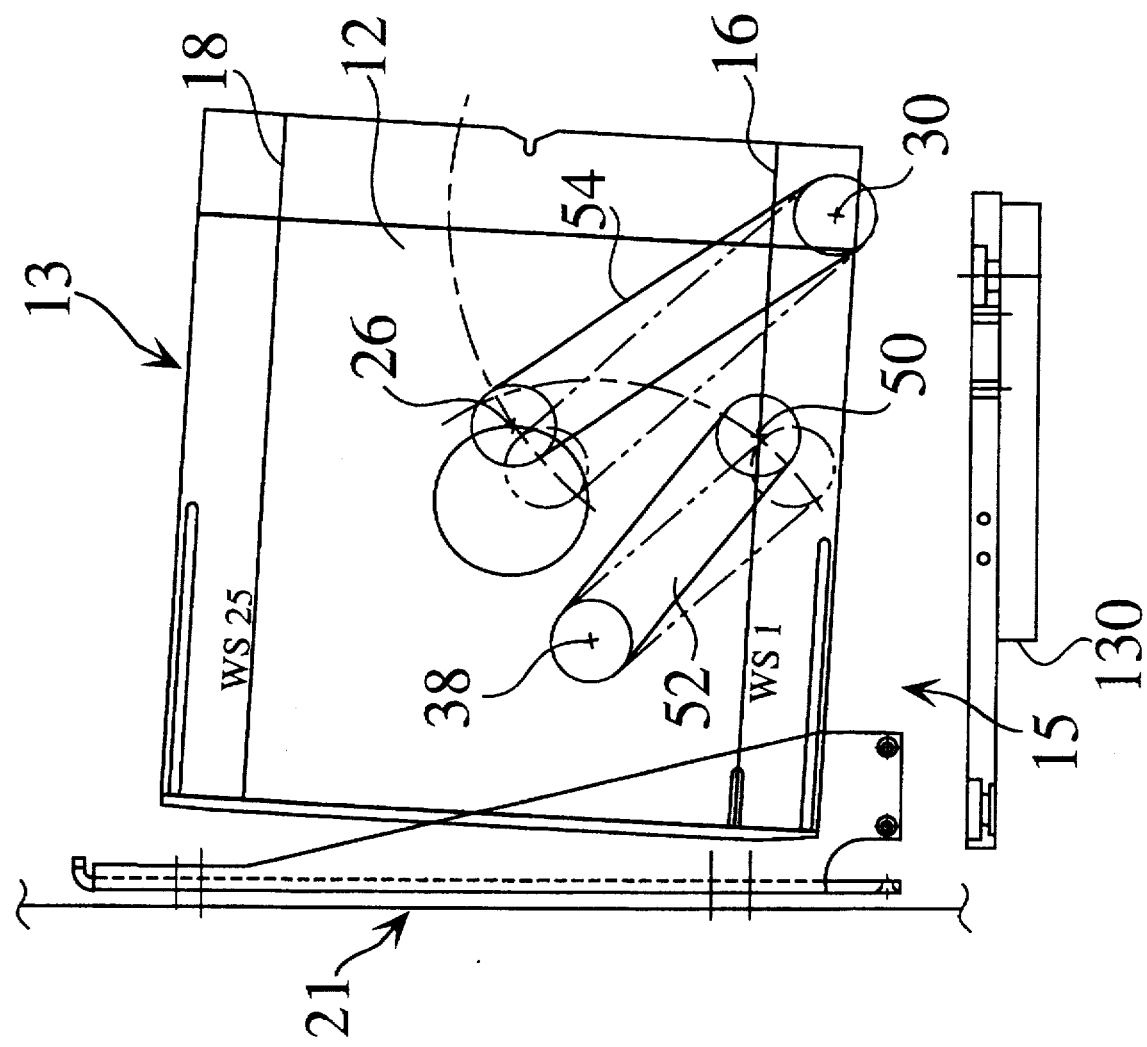
Figure 6C:
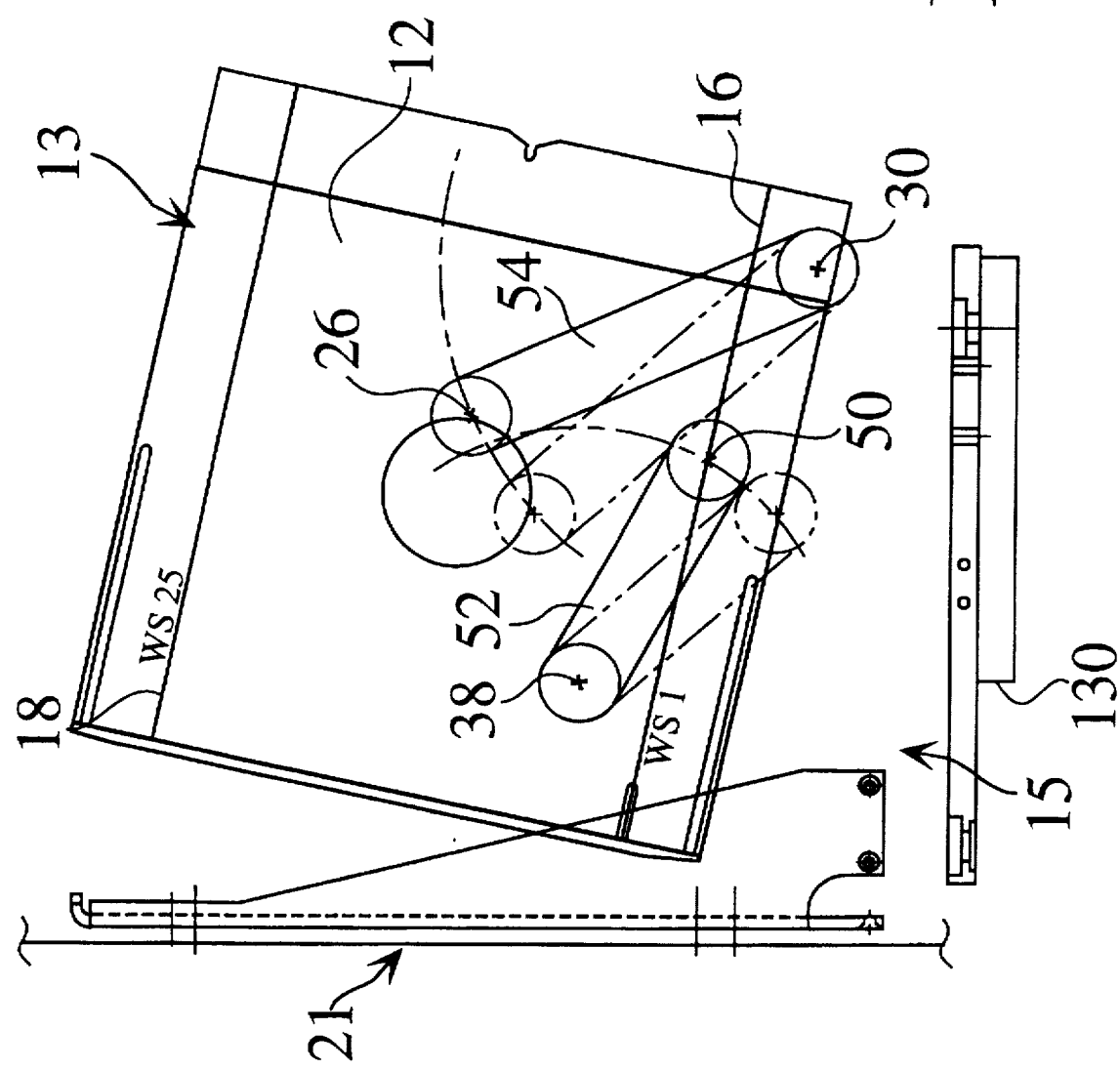
Figure 6D:
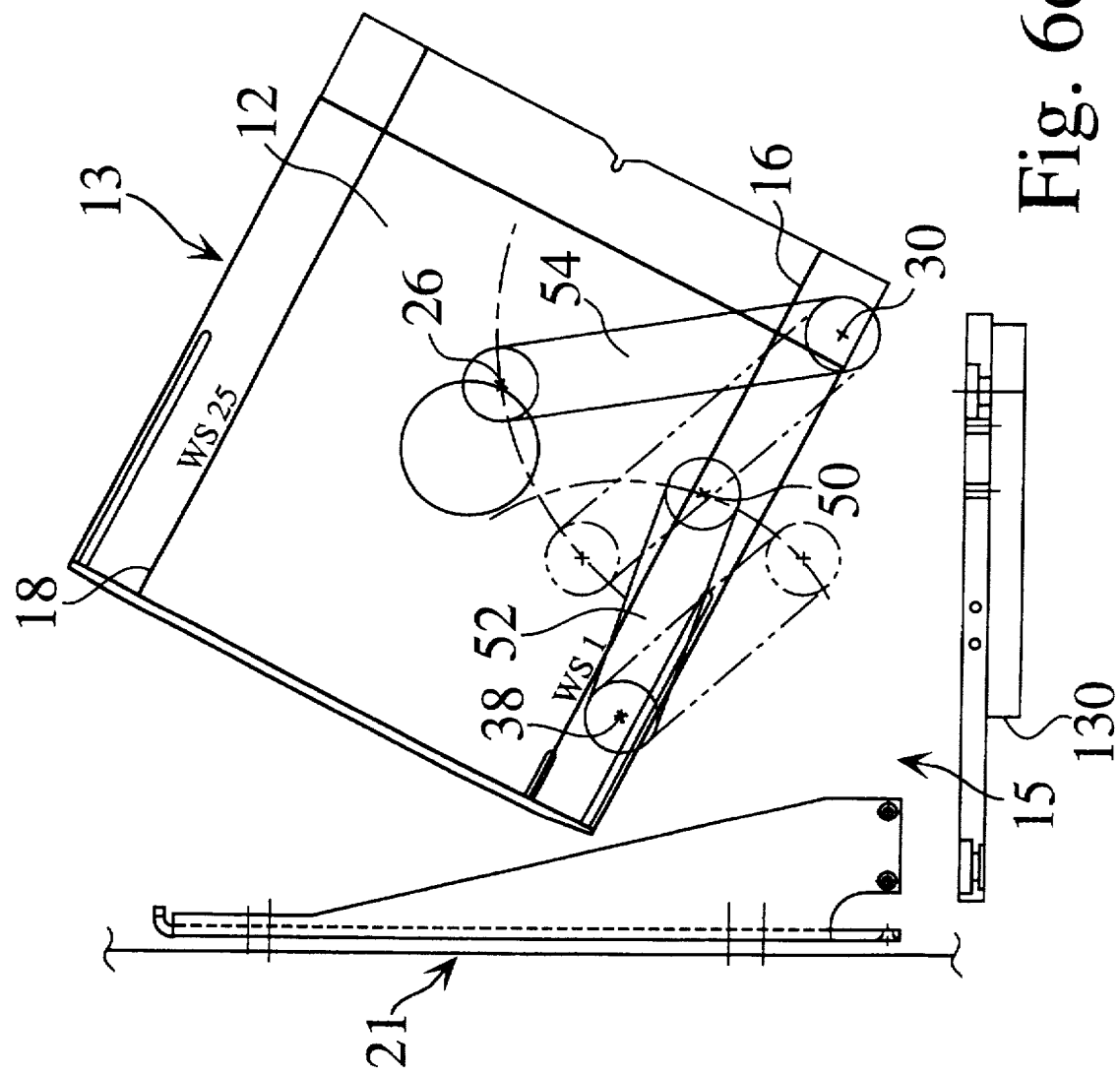
Figure 6E:
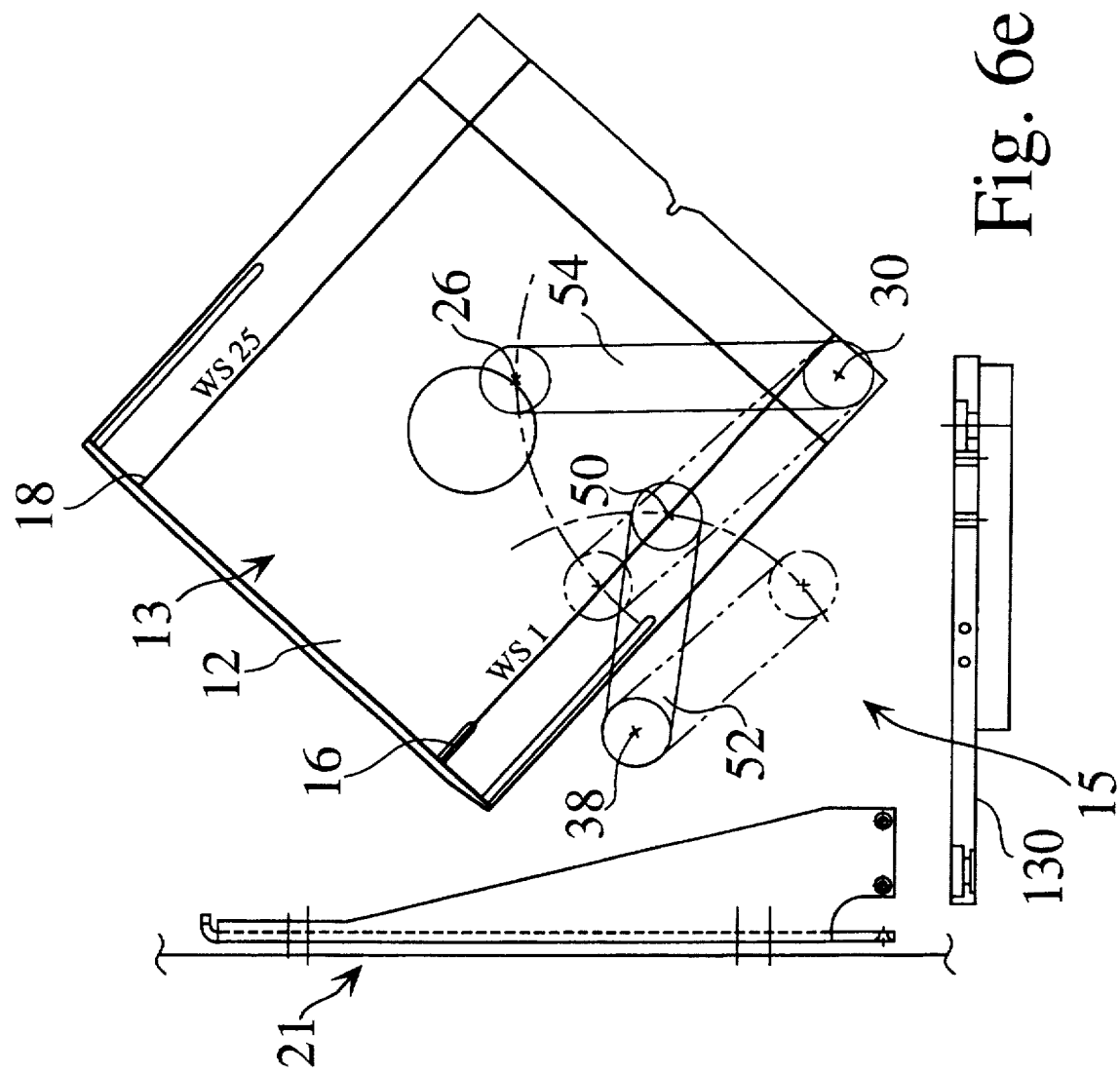
Figure 6F:
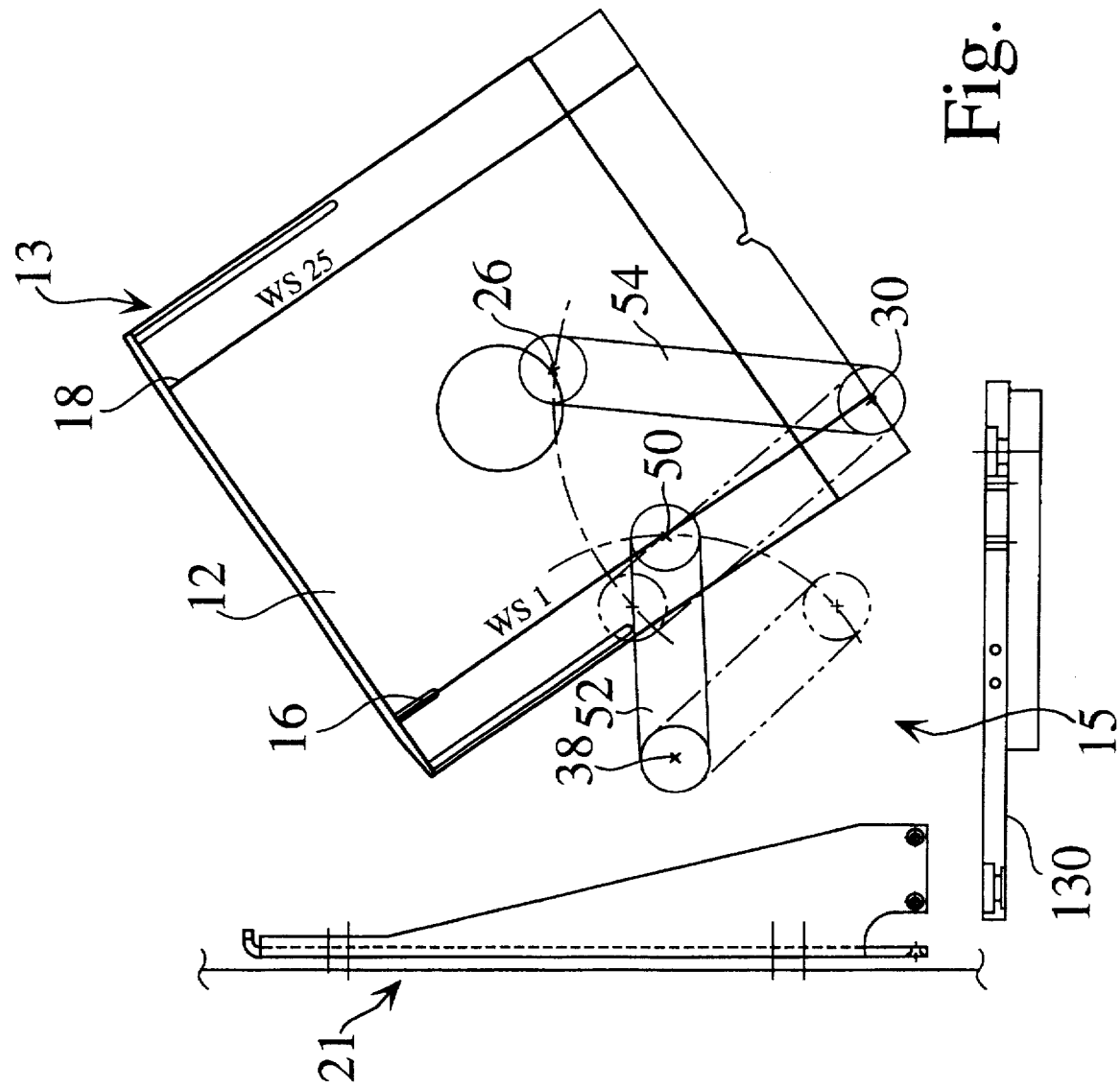

FIGS. 6a–6h provide a series of schematic side elevation views showing the compound translational cassette loading motion of the cassette loading mechanism according to the invention. In FIG. 6a, a cassette 12 is shown positioned, for example at a processing system wall 21, for substrate loading/unloading into and out of the system transfer chamber and the process chambers surrounding it. The cassette contains a plurality of substrates therein, e.g. from a first substrate 16 to a twenty-fifth substrate 18, all having a substantially horizontal orientation when the cassette is in its processing position adjacent to the wall 21 of the processing system.

In FIG. 6b, when the cassette is to be removed from the processing system 11, the carriage 13 begins to pivot away from the loading mechanism frame 15 (shown generally in relation to the carriage) as the tilt cylinder (not shown) exerts a drawing force upon the two bars 52, 54. As a result, the cassette is moved away from the process system wall 21.

The first bar 52 has one end fixed to the frame 15 at the pivot point 38 and another end fixed to the carriage at the pivot point 50. The first bar 52 is adapted to pivot the carriage about the two pivot points 38, 50 at each end thereof. At the same time, the first end of the bar 54 has one end fixed to the carriage at the pivot point 26 and another end fixed to the frame at the pivot point 30. Because each bar 52, 54 is attached to the carriage at the respective pivot points 50 and 26, the two bar ends remain at a fixed distance apart, although each bar end rotates about its respective pivot point during movement of the carriage. Because the other end of each bar is attached to the frame, and because each bar has a different pivot point on the carriage and a different length, the compound coordinated movement of the carriage relative to the two bars effects a translational movement of the carriage that lifts the cassette above the pivot point 30, while rotating the cassette to a substantially vertical orientation, as described above.

Figure 6G:
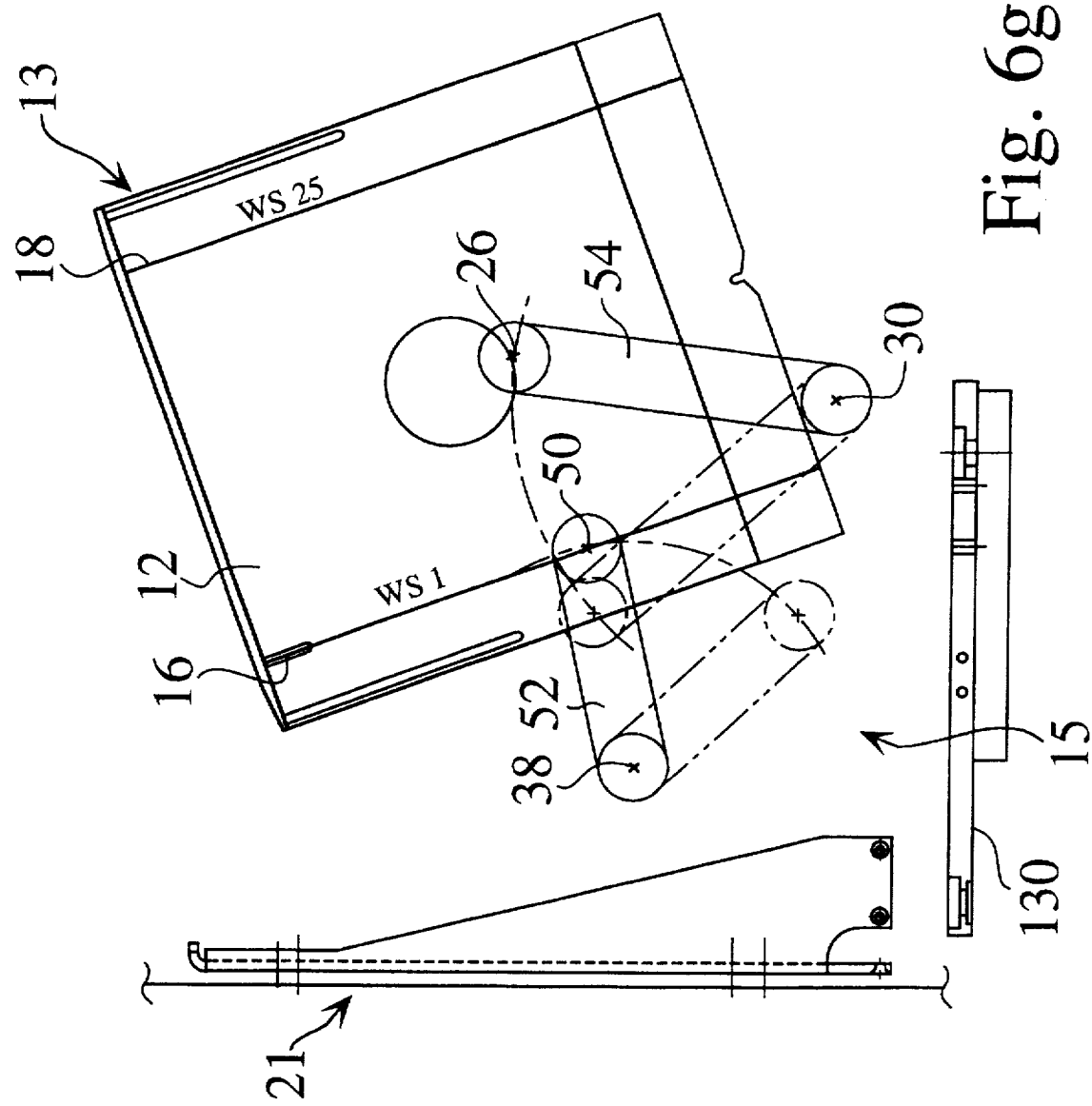
Figure 6H:
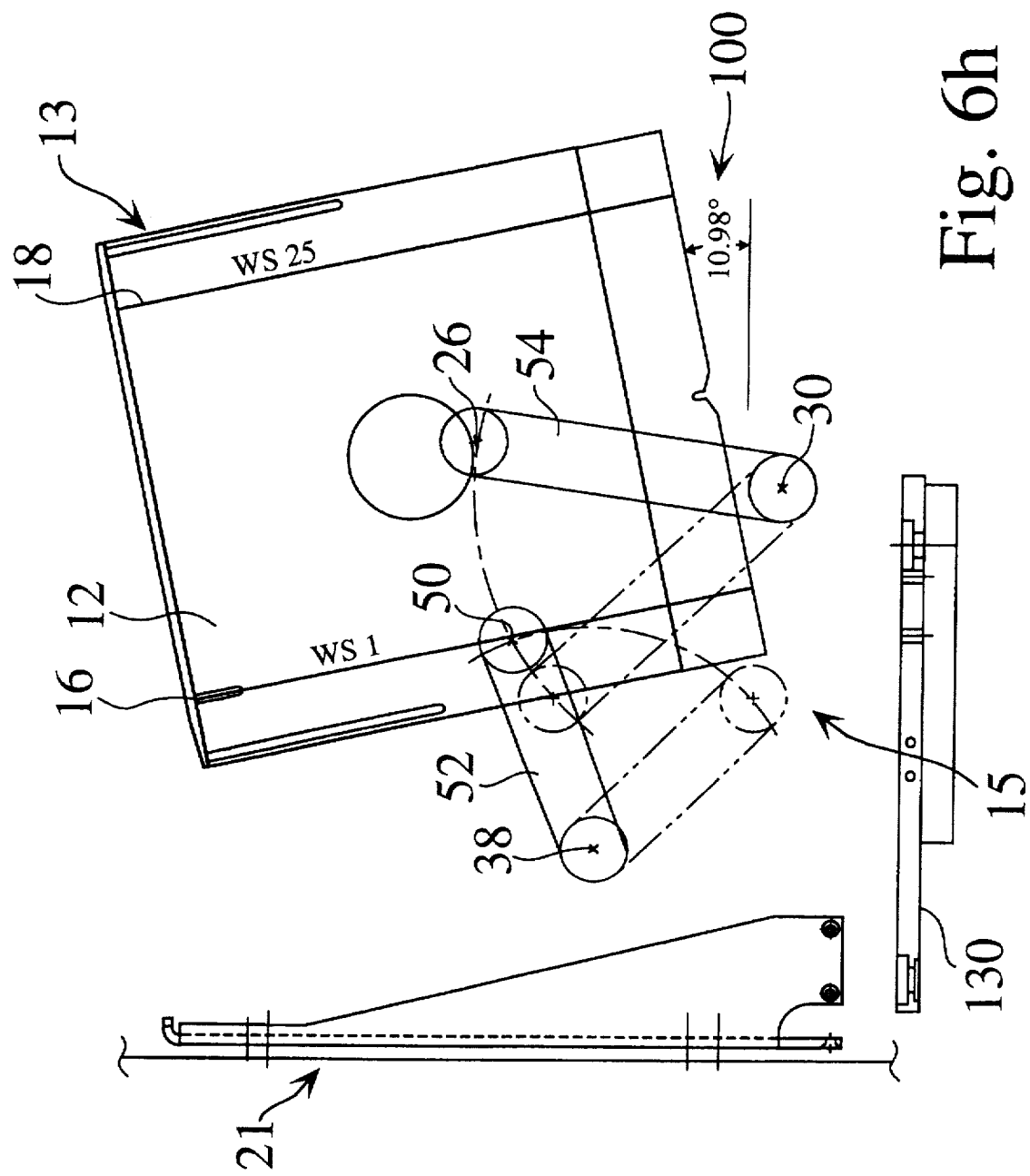

FIGS. 6c through 6h show relative movement of the two bars 52, 54 as the carriage continues to tilt the cassette to an operator access position (FIG. 6h) in which the carriage and cassette have been tilted to orient the substrates within the cassette at an angle of about 10° above vertical (as shown on FIG. 6h by the numeric designator 100). Thus, the cassette is positioned such that an operator need only move his wrist with about 10° of ulnar deviation to place and retrieve a cassette, well within the range of motion that may be repeated without injuring the operator's wrist.

The motion provided by the four-bar linkage mechanism herein is a compound motion. Initially, the carriage is lifted from the frame 15 (FIG. 6b–6f). Once the second end bar 54 approaches vertical by action of the tilt cylinder, the carriage 13 is rotated (FIGS. 6g, 6h).

While the action depicted in FIGS. 6a–6h is that of moving a cassette from a substrate loading/unloading position adjacent to the processing system wall 21 to an operator access position away from said wall, it should be appreciated that operation of the cassette loading mechanism to move the cassette from the operator access position to the substrate loading/unloading position follows the figures in descending order, i.e. FIGS. 6h–6a. Thus, the tilt cylinder 20 first moves the cassette at about a 45° angle to allow the carriage to pick up the cassette (FIGS. 6g and 6h); then the cassette is picked up and rotated at the approximate center of mass of the cassette, such that the cassette is moved under a variety of loads, i.e. a full cassette, a partially filled cassette, and a cassette having larger or smaller wafers contained therein, in a sure and controlled manner that does not jar or damage the substrates within the cassette, and that avoids the generation of contaminating particles.

Figure 7:
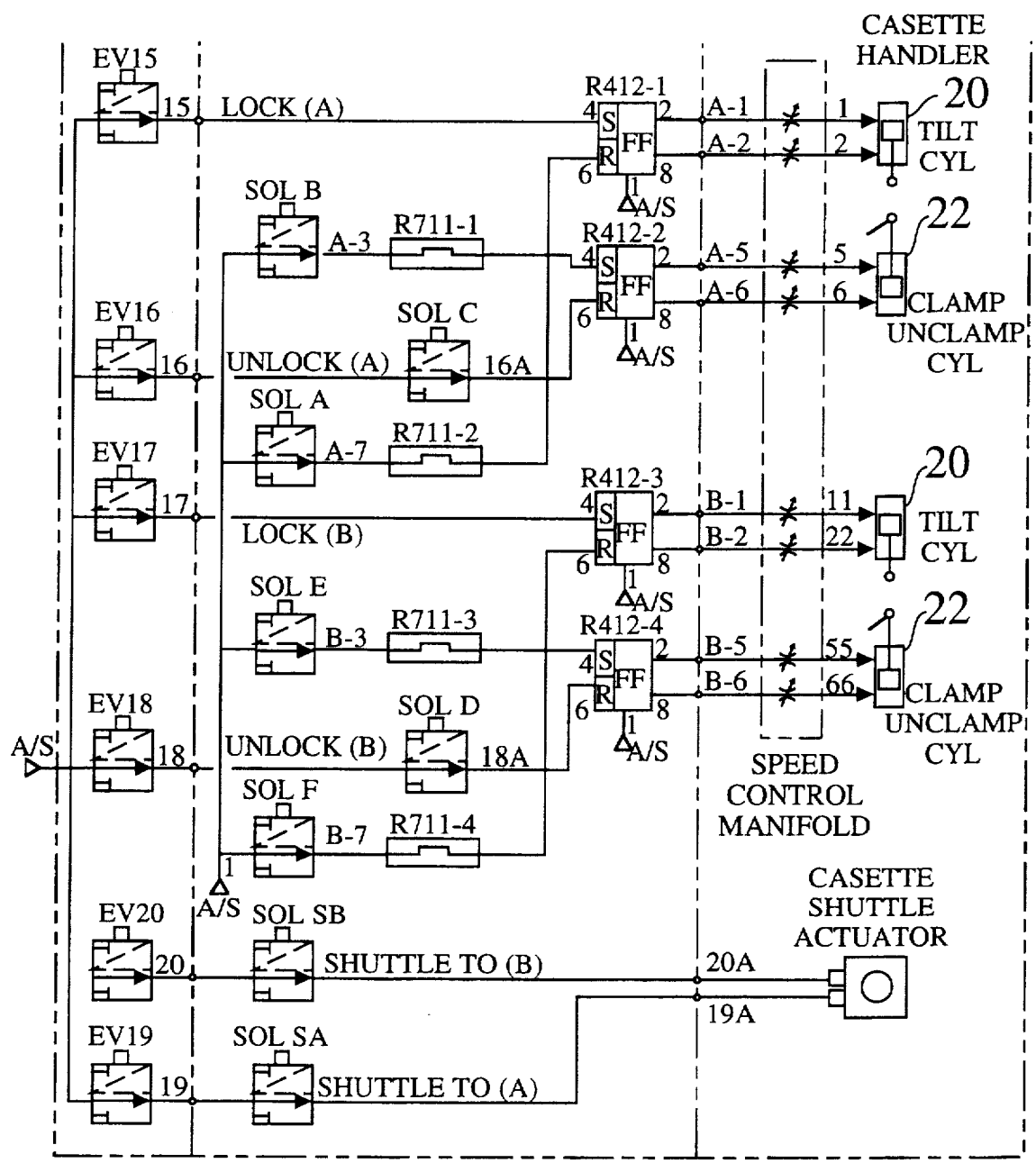
FIG. 7 is a schematic diagram of a pneumatic logic circuit according to the cassette loading mechanism of the invention.

FIG. 7 is a schematic diagram of a pneumatic logic circuit according to the invention. The pneumatic logic uses switches or other such sensors to monitor the position of the various cylinders, the cassette, the carriage, the clamp, and the process equipment doors (not shown). Redundant switches may be provided, for example the cassette present switch may be duplicated such that disengagement of one switch during cassette alignment does not give a false cassette not present indication to the operating system. See, for example FIG. 3, in which a cassette present switch 48 is shown.

Pneumatic logic reduces the pneumatic bundle within the process equipment and thereby reduces pneumatic turbulence therein, as well as reducing particle collecting surfaces. In this way, particle generation associated with the loading/unloading of a cassette of substrates is minimized by the invention. Alternatively, electronic logic may be used to control operation of the cassette loading mechanism.

In the figure, two pneumatic logic paths are shown for two cassette loading mechanisms, each of which has a respective tilt cylinder 20 and clamp cylinder 22. Both paths operate in substantially the same way. A first path LOCK(A) directs an air supply A/S to one tilt cylinder 20 and one clamp cylinder 22 by a circuit comprised of a post valve R711-1, R711-2 and a four-way valve R412-1, R412-2. A cassette shuttle circuit is also shown, including a cassette shuttle actuator. In the exemplary embodiment of the invention, the cassette shuttle moves the cassettes to the load/unload position of the system robot to allow up to 52 substrates to be processed in a continuous sequence.

The various sensors discussed above set the logic conditions that allow operation of the cassette loading mechanism. Because pneumatic logic is well known in the art, its operation is not discussed in detail herein. The use of such logic simplifies the construction and installation of the cassette loading mechanism, thus making the invention well suited for retrofitting to existing equipment without interfering with normal operation of the equipment, or requiring substantial reworking of the equipment, or operating software.

Figure 8:
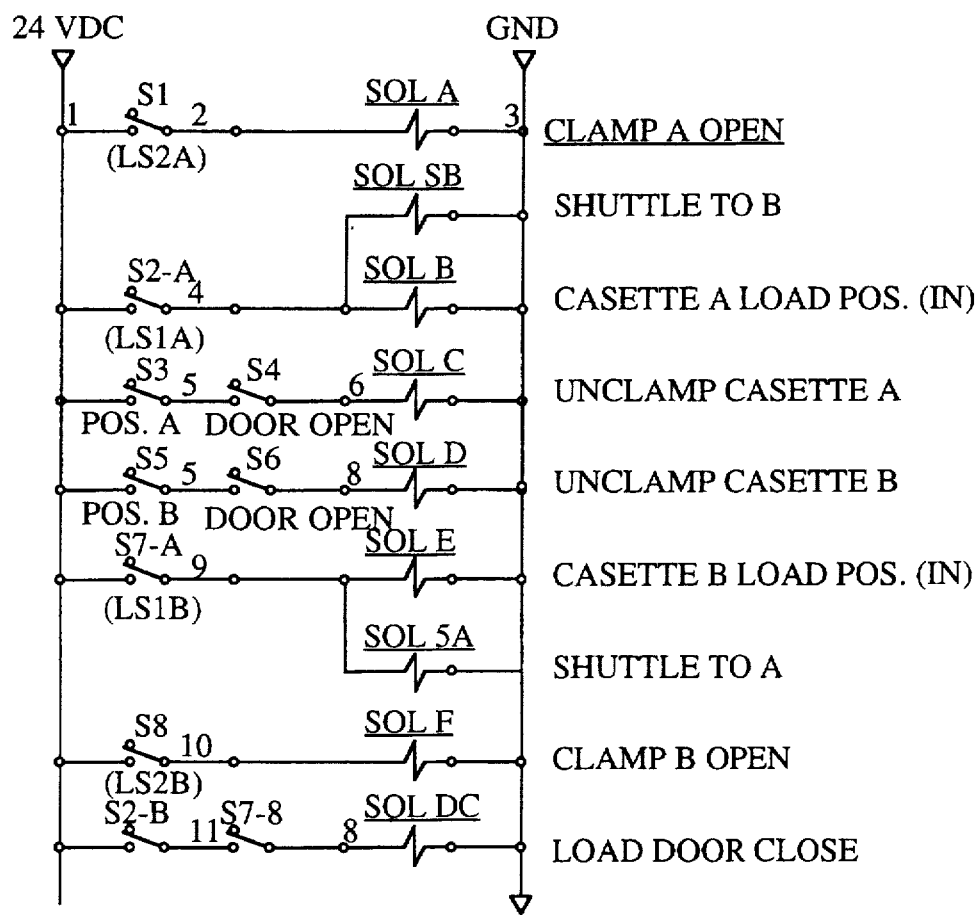
FIG. 8 is a schematic diagram of a pneumatic cassette clamp/unclamp circuit according to the cassette loading mechanism of the invention.

FIG. 8 is a schematic diagram of a pneumatic cassette clamp/unclamp circuit according to the invention. In the figure, various sensors are shown comprising a logic path that determines when all conditions are satisfied that allows the cassette to be clamped or unclamped for substrate loading/unloading. The circuit allows for separate cassette loading mechanisms to load the two loading ports 17, 19, for example as shown in FIG. 1.

Figure 9:
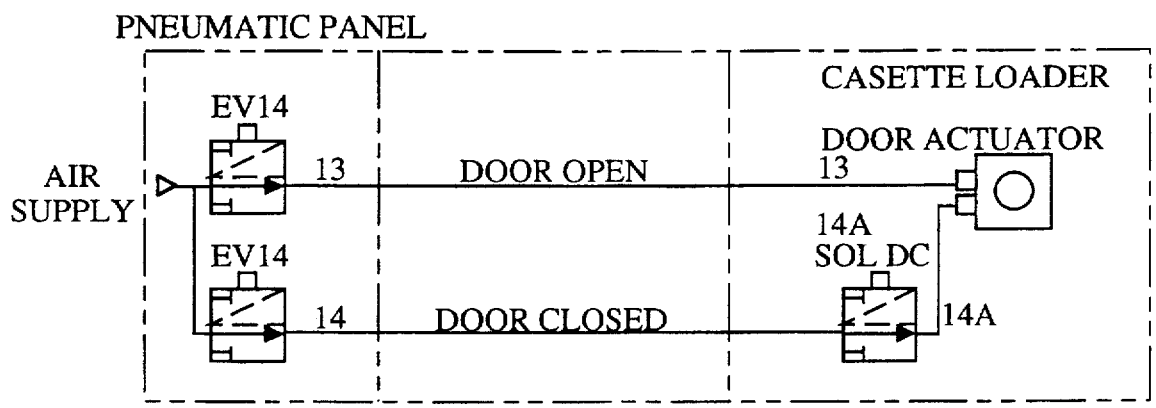
FIG. 9 is a schematic diagram of a pneumatic door actuator circuit according to the cassette loading mechanism of the invention.

FIG. 9 is a schematic diagram of a pneumatic door actuator circuit according to the invention (the door is discussed above in connection with FIG. 5). In the figure, an air supply is shown routed through two solenoid valves EV13, EV14 to a door actuator on the cassette loading mechanism. In this way, a door interlock is provided that prevents the process environment from exposure to the ambient. Thus, the process environment is not accessible until all conditions are satisfied that indicate the cassette is positioned in alignment for cassette loading/unloading. SOL DC (door closed) provides an interlock that prevents the door from closing when the cassette loading mechanism is in an open or load/unload state.

Although the invention is described herein with reference to the preferred embodiment, one skilled in the art will readily appreciate that other applications may be substituted for those set forth herein without departing from the spirit and scope of the present invention. Accordingly, the invention should only be limited by the claims included below.

We claim:

1. A substrate cassette loading apparatus for automatically placing a cassette at a processing equipment loading port, comprising:

a cassette carriage adapted to receive and secure said substrate cassette, and for effecting compound translational rotation of said substrate cassette from an operator placement orientation in which substrates within the cassette are positioned at a first orientation, to a substrate loading/unloading position in which said substrates in the cassette are positioned at a second orientation;

a loading mechanism frame;

a linkage mechanism; and motive means for selectively operating said linkage mechanism, wherein said linkage mechanism is adapted to effect said compound translational substrate cassette rotation, and said linkage mechanism comprises a first bar having a first end pivotally coupled to said loading mechanism frame at a first pivot point, and having a second end that is pivotally coupled to said motive means at a second pivot point, and that is pivotally coupled to said carriage at a third pivot point and a second bar having a first end pivotally coupled to a fourth pivot point, and having a second end pivotally coupled to said frame at a fifth pivot point, wherein said compound translational rotation effected by said linkage mechanism comprises a lifting movement in which said cassette is lifted into engagement with said carriage, and a rotational movement in which said cassette and said carriage are rotated about a carriage rotation axis.

2. The apparatus of claim 1, further comprising:

a clamp for selectively securing said cassette to said carriage after translational motion and substrate loading/unloading.

3. The apparatus of claim 2, said clamp means further comprising:

a clamp cylinder selectably operable to secure said cassette to an alignment mechanism for an internal substrate transfer robot.

4. The apparatus of claim 1, further comprising:

logic means adapted to operate said motive means.

5. The apparatus of claim 4, said logic means further comprising:

either of an electronic logic circuit and a pneumatic logic circuit.

6. The apparatus of claim 5, further comprising:

means for effecting substrate cassette alignment with said carriage.

7. A substrate cassette loading apparatus for automatically placing a cassette at a processing equipment loading port, comprising:

a cassette carriage adapted to receive and secure thereto said substrate cassette;

a loading mechanism frame;

a linkage mechanism;

motive means for selectively operating said linkage mechanism, wherein said linkage mechanism comprises a first bar having a first end pivotally coupled to said loading mechanism frame at a first pivot point, and having a second end that is pivotally coupled to said motive means second pivot point, and that is pivotally coupled to said carriage at a third pivot point, a second bar having a first end pivotally coupled to said second end of said first bar at said third pivot point, a third bar having a first end pivotally coupled to a second end of said second bar at a fourth pivot point, and having a second end pivotally coupled to said frame at a fifth pivot point, said linkage mechanism adapted to effect rotation of said carriage and said substrate cassette from an operator placement orientation in which substrates within the cassette are positioned at a first orientation, to a substrate loading/unloading position in which said substrates in the cassette are positioned at a second orientation, wherein said rotation effected by said linkage mechanism comprises a rotational movement in which said cassette and said carriage are rotated about a carriage rotation axis, said linkage further adapted to effect compound translational rotation of said carriage, wherein said compound translational rotation further comprises a lifting movement in which said cassette is lifted into engagement with said carriage; and a clamp for selectably securing said cassette to said carriage during substrate loading/unloading.

8. The apparatus of claim 7 wherein said clamp means further comprises:

a clamp cylinder selectably operable to secure said cassette to a substrate load/unload platform.

9. The apparatus of claim 7, further comprising:

a logic means adapted to operate and control said motive means.

10. The apparatus of claim 9, said logic means further comprising:

either of an electronic logic circuit and a pneumatic logic circuit.

11. The apparatus of claim 7, further comprising:

means for effecting substrate cassette alignment with said carriage.

12. The apparatus of claim 7, wherein said first orientation is a substantially vertical orientation and wherein said second orientation is a substantially horizontal orientation.

13. The apparatus of claim 7, wherein said first orientation is a substantially horizontal orientation and wherein said second orientation is a substantially vertical orientation.

14. A process for automatically placing a substrate cassette at a processing equipment loading port, comprising the steps of:

placing a horizontally-oriented substrate cassette containing substantially vertically-oriented substrates at an inclined angle from the horizontal onto a cassette carriage adapted to receive and secure said substrate cassette;

providing first and second bars;

pivotally coupling a first end of said first bar to a loading mechanism frame at a first pivot point;

pivotally coupling a second end of said first bar to a motive means at a second pivot point;

pivotally coupling said second end of said first bar to said carriage at a third pivot point;

pivotally coupling a first end of said second bar to said carriage at a fourth pivot point;

pivotally coupling second end of said second bar to said frame at a fifth pivot point;

rotating said first and second bars about said pivot points with said motive means to lift said cassette into engagement with said carriage and rotate said cassette and said carriage about a carriage rotation axis; and removing said substrates from said cassette at said loading/unloading position.

15. The process of claim 14, further comprising the step of:

aligning said substrate cassette with a substrate load/unload platform.

* * * * *